United States Patent
Chirania et al.

(10) Patent No.: US 7,518,394 B1
(45) Date of Patent: Apr. 14, 2009

(54) PROCESS MONITOR VEHICLE

(75) Inventors: Manoj Chirania, Palo Alto, CA (US); Philip D. Costello, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 26 days.

(21) Appl. No.: 11/703,862

(22) Filed: Feb. 7, 2007

(51) Int. Cl.
H03K 19/00 (2006.01)

(52) U.S. Cl. .......................... 326/16; 324/765

(58) Field of Classification Search ............ 326/45, 326/16; 324/500, 763, 765; 365/189.05, 365/189.11, 189.12, 240; 331/44, 57
See application file for complete search history.

(56) References Cited

U.S. PATENT DOCUMENTS

| | | | | |
|---|---|---|---|---|
| 5,812,469 A | * | 9/1998 | Nadeau-Dostie et al. | .... 365/201 |
| 6,239,616 B1 | * | 5/2001 | Churcher et al. | .............. 326/49 |
| 6,734,744 B2 | * | 5/2004 | Monzel et al. | ................ 331/57 |
| 7,142,064 B2 | * | 11/2006 | Chan et al. | .................... 331/57 |

* cited by examiner

*Primary Examiner*—Rexford Barnie
*Assistant Examiner*—Christopher Lo
(74) *Attorney, Agent, or Firm*—Michael T. Wallace; Michael R. Hardaway (57) ABSTRACT

A method and apparatus is provided for the implementation of a process monitor vehicle (PMV) for memory cells. The memory cell PMV is useful in characterizing drive strength of the N-type and P-type field effect transistors (FETs) that are used to implement the memory cell. The memory cell PMV may be used, for example, to measure the amount of margin available for memory cell flips and how process variation affects the memory cell write margin. The memory cell PMV is implemented as a plurality of shift register bits interconnected as a ring oscillator, where each shift register bit is comprised of a memory cell. By adjusting the drive current for each memory cell and measuring the resultant change in oscillation frequency of the ring oscillator, information may be obtained concerning process variation and its effect on memory cell performance.

14 Claims, 5 Drawing Sheets

PROCESS MONITOR VEHICLE

FIELD OF THE INVENTION

The present invention generally relates to a programmable logic devices (PLDs), and more particularly to PLDs configured to perform process monitoring.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is determined by the data bits used to configure the reconfigurable resources of the device. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Since PLDs are implemented on a single substrate using integrated circuit (IC) processes, PLD performance is somewhat dependent upon process variation. As such, process monitor circuits are used to quantify and characterize the effects of process variation. Such process monitor circuits are defined as process monitors vehicles (PMVs) and have proven to be useful in determining the effects of process variation, so that the process may be guided for maximum performance.

Conventional PMVs have been implemented, for example, to perform various process monitoring tasks, such as: characterization of process variation over various metal layers; characterization of diffusion and gate capacitance; and characterization of various circuit implementations, such as look-up tables (LUTs) and programmable interconnects. No such PMVs are available, however, to monitor process variation effects on memory cells. Thus, a need exists for a memory cell PMV, so that process variation effects on memory cell operation can be characterized.

SUMMARY

To overcome limitations in the prior art, and to overcome other limitations that will become apparent upon reading and understanding the present specification, various embodiments of the present invention disclose an apparatus and method for a process monitor vehicle for memory cells.

In accordance with one embodiment of the invention, a process monitor vehicle (PMV) comprises a plurality of shift register bits that are coupled in series and a logic gate that is coupled to receive an enable signal and an output signal from a last shift register bit of the plurality of shift register bits and is further coupled to provide an input signal to a first shift register bit of the plurality of shift register bits. Each shift register bit includes a memory cell block that is adapted to latch the input signal, a first inverter that is coupled to receive the latched input signal from the memory cell block and is adapted to provide the latched input signal as an output signal in response to a programmable drive current. The PMV further comprises a write driver that is coupled to a power supply reference of the first inverter. The write driver is adapted to conduct a programmable magnitude of current from the power supply reference of the first inverter to set the programmable drive current.

In accordance with another embodiment of the invention, a process monitor vehicle (PMV) block comprises a memory cell block that is adapted to latch an input signal and a first inverter that is coupled to receive the latched input signal from the memory cell block and is adapted to provide the latched input signal as an output signal in response to a programmable drive current. The PMV block further comprises a write driver that is coupled to a power supply reference of the first inverter. The write driver is adapted to conduct a programmable magnitude of current from the power supply reference of the first inverter to set the programmable drive current.

In accordance with another embodiment of the invention, an integrated circuit (IC) comprises a plurality of programmable logic blocks that are coupled to receive configuration data into a plurality of memory cells. The plurality of programmable logic blocks include programmable logic devices and programmable interconnections that are configured to perform a logic function in response to the configuration data. The IC further comprises a plurality of process monitor vehicle (PMV) blocks that are displaced within the plurality of programmable logic blocks. Each PMV block includes a memory cell that is adapted to latch an input signal, an inverter that is coupled to receive the latched input signal from the memory cell and is adapted to provide the latched input signal as an output signal in response to a programmable drive current, and a write driver that is coupled to a power supply reference of the inverter. The write driver is adapted to conduct a programmable magnitude of current from the power supply reference of the inverter to set the programmable drive current.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided for the implementation of a process monitor vehicle (PMV) for memory cells. A process monitor vehicle (PMV) is a circuit implemented in an integrated circuit for monitoring a process within the IC. One embodiment of the present invention is enabled to monitor a process implemented in a memory block of a programmable logic device.

The memory cell PMV is useful in characterizing drive strength of the N-type and P-type field effect transistors (FETs) that are used to implement the memory cell. The memory cell PMV may be used, for example, to measure the amount of margin available for memory cell flips and how process variation affects the write margin.

In one embodiment, a memory cell PMV block may be implemented with a memory cell followed by an inverting logic block. The memory cell PMV block may further be coupled in series with a programmable write block, whereby the output drive level of the programmable write block is selectable between a plurality of drive levels. In particular, the write block may be implemented with multiple, pull-down transistor stacks, where each transistor stack exhibits a pull-down strength, i.e., drive level, that ranges from "strong" to "very weak". The conductivity state of each pull-down transistor stack is selected via a control signal, such that the drive level of the programmable write block is selectable and is dependent upon which pull-down transistor stack is activated.

Multiple combinations of the memory cell, inverter, and programmable write block may then be cascaded in series to form a multiple bit shift register. The output of the shift register may then be fedback to the input of the shift register, via enabling logic, so as to form a ring oscillator. Upon activation, the oscillation frequency of the ring oscillator may then be measured for each pull-down transistor stack selected. Thus, given that each pull-down transistor stack is a simulation of a process corner, the oscillation frequency measured for each pull-down transistor stack provides a measure of performance for each simulated drive level.

That is to say, for example, that if the drive level of the programmable write block is selected to the "very weak" setting, then a worst case process corner is simulated. In such an instance, the pull-down current of the programmable write block is minimized, such that some or all of the memory cells within the ring oscillator may not flip, i.e., their logic states may not change value. Thus, if no oscillation is measured, then a lower margin of process variation based performance may be established.

The drive level of the programmable write block may then be selected to the "slow" setting, e.g., the drive current of the programmable write block may be increased by a programmable amount relative to the "very weak" setting. The resulting oscillation frequency may then be recorded and regarded as being characteristic of the performance level that is achievable at the "slow" process corner. It can be seen, therefore, that subsequent selection of increasing drive levels of the programmable write block, and the corresponding increases in oscillation frequency of the ring oscillator, may be used to accurately characterize margin and performance over a wide range of process corners.

As noted above, advanced ICs, such as field programmable gate arrays (FPGAs), can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104. For example, a CLB 102 may include a Configurable Logic Element CLE 112 that may be programmed to implement user logic plus a single programmable interconnect element INT 111. A BRAM 103 can include a BRAM logic element (BRL 113) in addition to one or more programmable interconnect elements.

Figure 1:
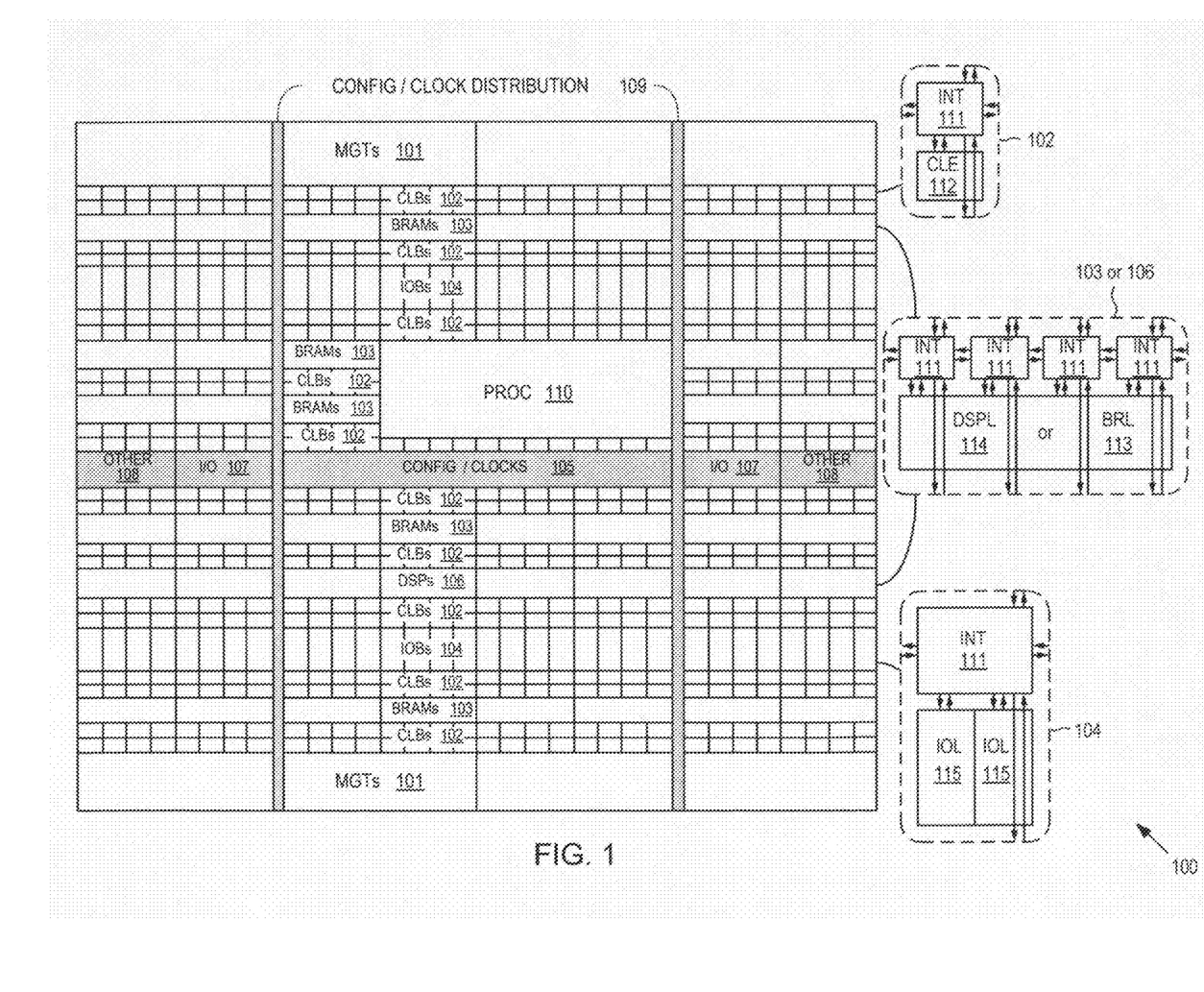
FIG. 1 illustrates an exemplary Field Programmable Gate Array (FPGA) architecture.

Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111. As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Memory cell PMVs may also be implemented, for example, within other blocks 108, so as to allow characterization of various areas within FPGA 100 for process variation on memory cell performance.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs. Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

Figure 2:
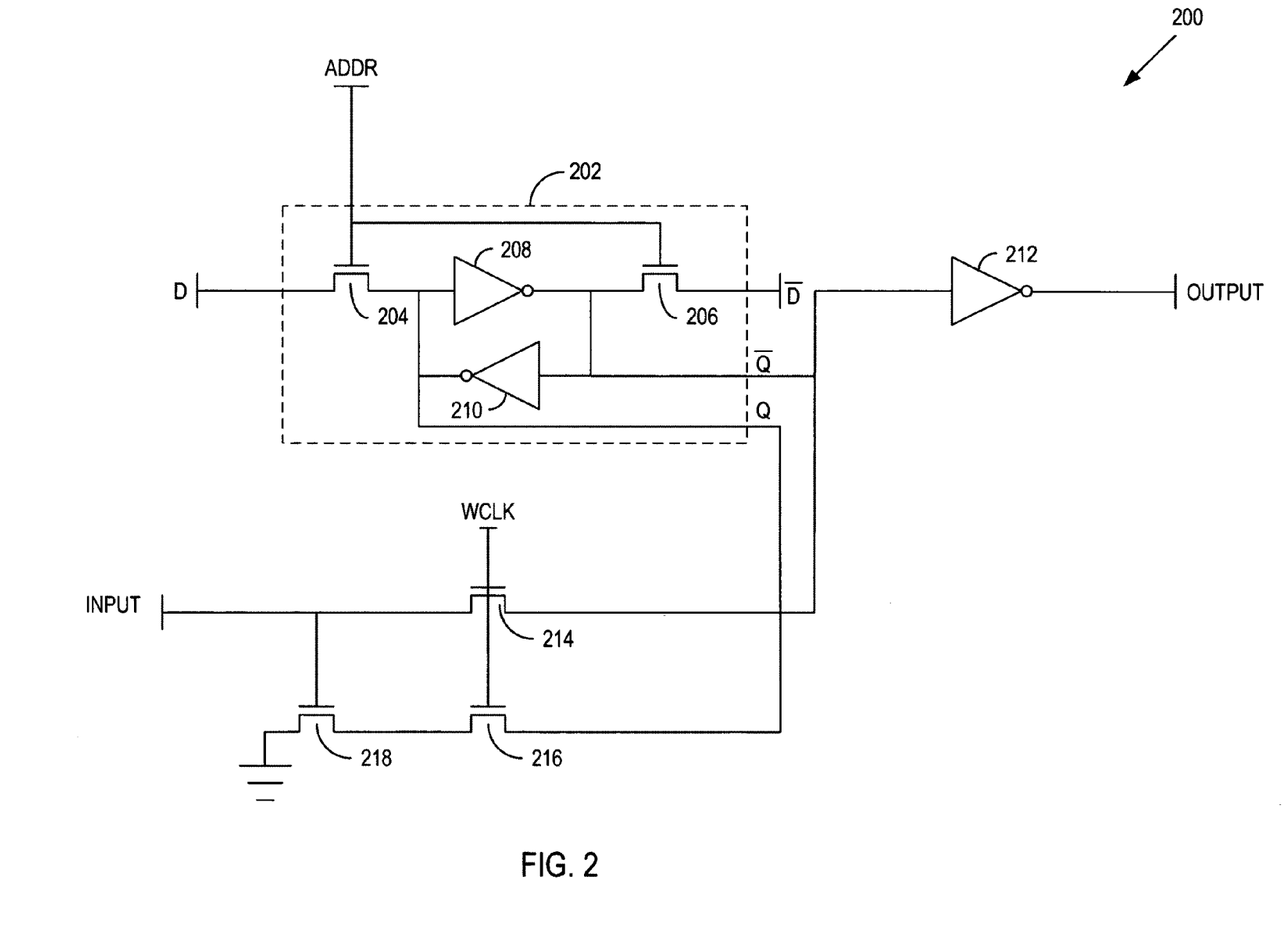
FIG. 2 illustrates an exemplary schematic diagram of a memory cell block.

Turning to FIG. 2, an exemplary schematic diagram of memory cell block 200 is illustrated. Memory cell 202 may be implemented with back-to-back connected inverters 208 and 210 as shown. Pass gate 204 is coupled to the common node at the input of inverter 208 and the output of inverter 210 between terminals D and Q. Pass gate 206 is coupled to the common node at the input of inverter 210 and the output of inverter 208 between terminals $\overline{D}$ and $\overline{Q}$.

In addition to memory cell 202, a programming circuit consisting of transistors 214-218 is provided whereby the initial logic state of memory cell 202 may be programmed. Terminal INPUT, for example, is coupled to terminal $\overline{Q}$ via passgate 214, while terminal INPUT is additionally coupled to terminal Q via series connected pass gates 218 and 216.

In operation, a logic low level is applied to terminals D, ADDR, and $\overline{D}$. The initial state of memory cell 202 may be programmed by applying the required initial logic level to terminal INPUT and asserting terminal WCLK to a logic high level. Establishing a logic high level at the control terminals of pass gates 214 and 216, via signal WCLK, maintains pass gates 214 and 216 in their respective conductive states, whereby the logic level applied to terminal INPUT may then be applied to the input of inverters 210 and 208 at terminals $\overline{Q}$ and Q, respectively. Since the write speed associated with memory cell 202 is the most critical parameter to be characterized, terminal WCLK may be maintained at a logic high level during characterization of memory cell 202.

If signal INPUT is selected to a logic high level, for example, then the input to inverter 210 is selected to a logic high level via passgate 214. In addition, transistor 218 is selected to its conductive state, whereby a first conductor of transistor 216 is selected to a reference voltage, e.g., ground potential. As such, the input to inverter 208 is also selected to the reference voltage by virtue of the conductive states of transistors 218 and 216 to initialize memory cell 202 to a logic low value. Similar operation may be verified when a logic low signal at terminal INPUT is selected to initialize memory cell 202 to a logic high value.

Figure 3:
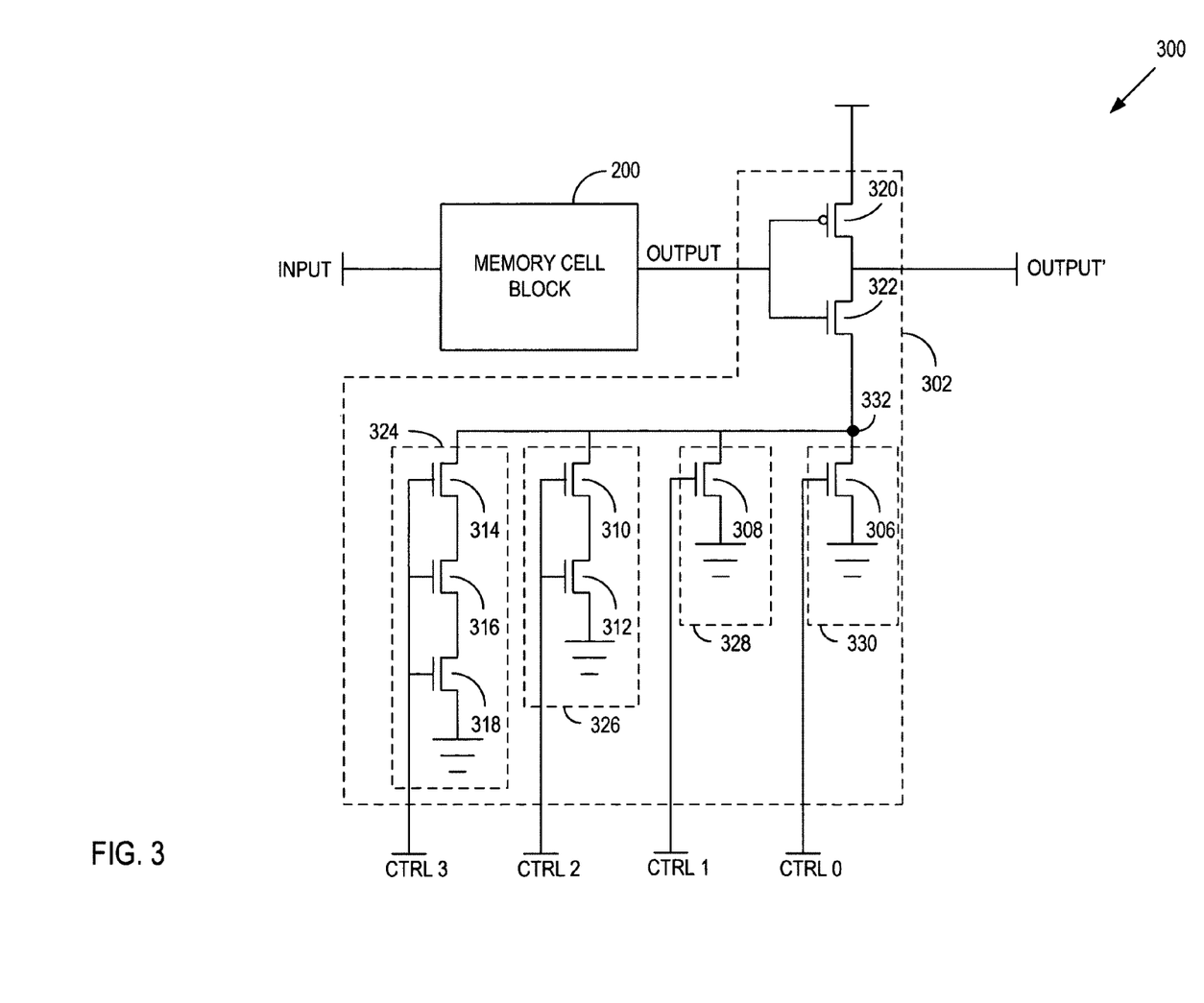
FIG. 3 illustrates an exemplary schematic diagram of a process monitor vehicle (PMV) block that incorporates the memory cell block of FIG. 2.

Turning to FIG. 3, an exemplary schematic diagram of PMV block 300 is illustrated, whereby programmable write driver 302 may be coupled in series with memory cell block 200 of FIG. 2 as shown. In particular, transistors 320 and 322 combine to form an inverter, which receives signal OUTPUT from memory cell block 200 and inverts signal OUTPUT to form signal OUTPUT'. As discussed in more detail below, signal OUTPUT' is generated using a programmable amount of drive current when signal OUTPUT' is at a logic low level, i.e., when transistor 322 is conductive, so that several process corners may be simulated.

A first conductor of transistor 322 is coupled to first conductors of transistor stacks 324-330 at node 332. The control terminals of each transistor within transistor stacks 324-330 are coupled to control signals CTRL3-CTRL0, whereby the conductivity state of each transistor within transistor stacks 324-330 may be programmably controlled. Setting control signal CTRL0 to a logic high level and setting control signals CTRL1-CTRL3 to a logic low level, for example, renders transistor stack 330 conductive, while transistor stacks 324-328 are rendered non-conductive.

Each of transistors 306-318 may exhibit geometric dimensions, such that during their respective conductive states, a programmable amount of current may be conducted from node 332. For example, the channel width and channel length of transistor 306 may be set such that a maximum amount of current is conducted by transistor stack 330 from node 332 when transistor 306 is made to be conductive in response to control signal CTRL0. Similarly, the channel width and channel length of transistor 308 may be set such that a decreased amount of current, relative to the current conducted by transistor 306, is conducted by transistor stack 328 from node 332 when transistor 308 is made to be conductive in response to control signal CTRL1.

Series connected transistors 310-318 within transistor stacks 326 and 324, respectively, may also conduct decreasingly smaller amounts of current from node 332 in response to control signals CTRL2 and CTRL3, respectively. That is to say, in other words, that while the channel width and channel length of transistors 310-318 may be set such that a decreased amount of current may be conducted, the series connection of transistors 310-312 and 314-318 also decreases the current conduction capability. It can be seen, therefore, that the drive current at node 332 may be adjusted via control signals CTRL3-CTRL0 to simulate drive level process corners for each PMV block 300 as necessary. Thus, by programmably selecting each of transistor stacks 324-330 to be independently conductive, process corners exhibiting "weak", "slow", "typical", and "fast" performance levels, respectively, may be simulated.

Figure 4:
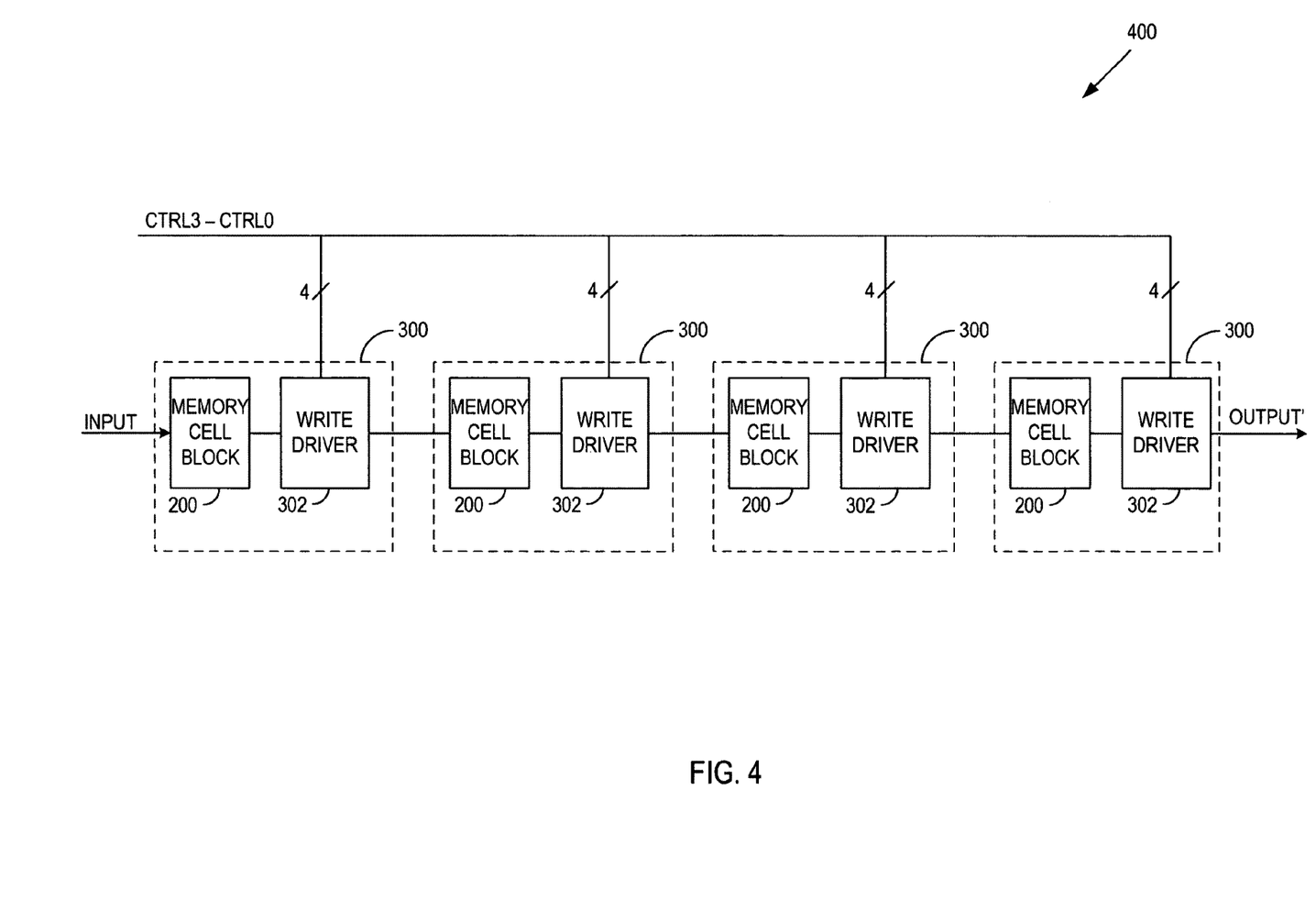
FIG. 4 illustrates an exemplary block diagram of a multiple bit shift register implemented using a plurality of the PMV blocks of FIG. 3.

Now referring to FIG. 4, an exemplary block diagram of shift register 400 is implemented using series connected PMV blocks 300 as discussed above in relation to FIG. 3. In particular, each PMV block comprises memory cell 200, as discussed above in relation to FIG. 2, and programmable write driver 302, as discussed above in relation to FIG. 3. The shift register is implemented by successively coupling PMV blocks 300 in series with each other by connecting, for example, the OUTPUT' terminal of programmable write driver 302 of a first PMV block 300 to the INPUT terminal of memory cell block 200 of a second PMV block 300.

The initial logic state of each memory cell block 200 may be initialized via the programming circuit (not shown in FIG. 4) as discussed above in relation to FIG. 2. Control signals CTRL3-CTRL0 are routed to each programmable write driver 302 to simulate programmable drive levels as discussed above in relation to FIG. 3. It can be seen by inspection that shift register 400 exhibits a 4-bit shift register, but it is known that any number of bits may be implemented by cascading a corresponding number of PMV blocks 300 as required.

Figure 5:
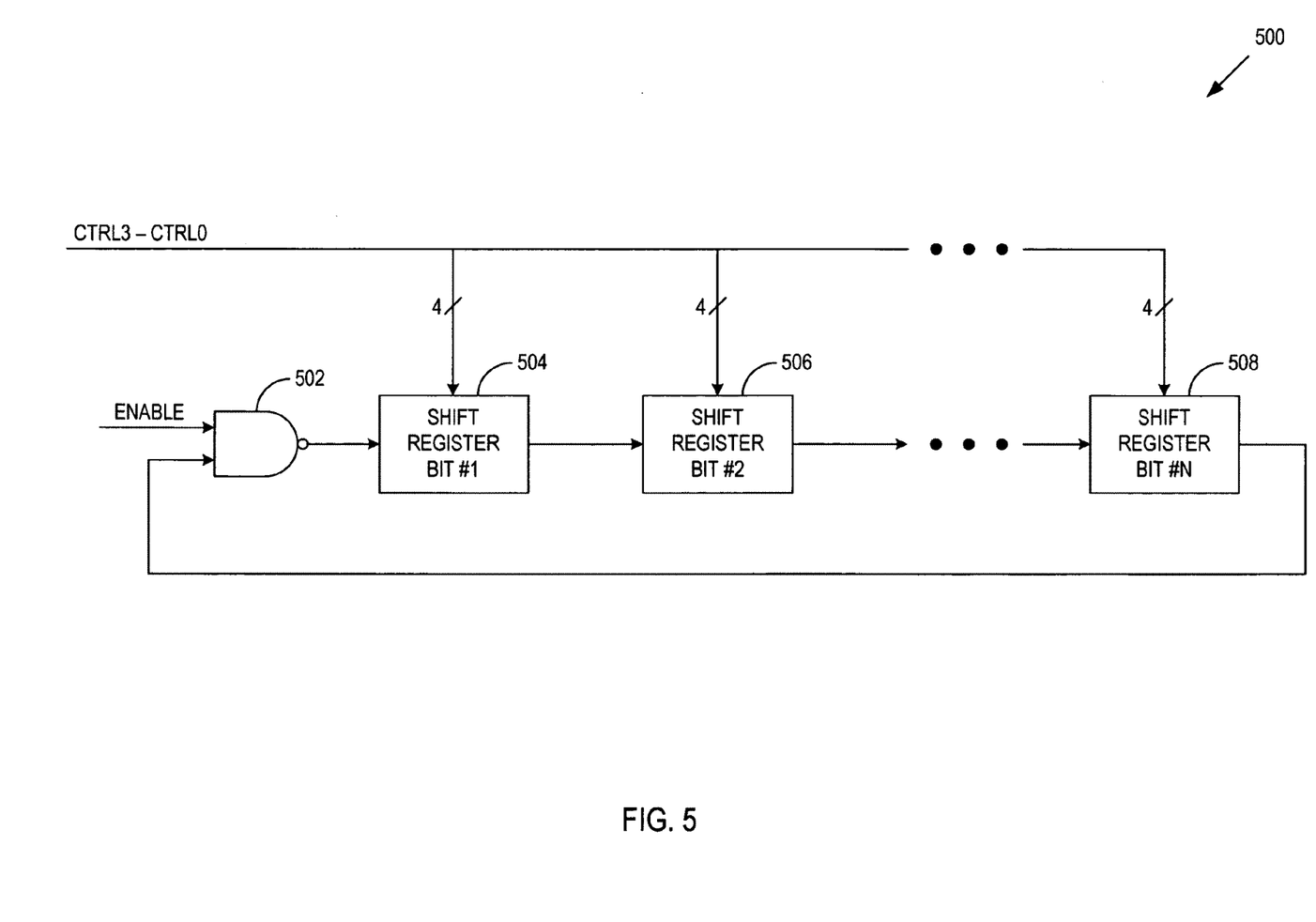
FIG. 5 illustrates an exemplary block diagram of a shift register implementation of a ring oscillator using the PMV blocks of FIG. 3.

Turning to FIG. 5, an exemplary block diagram of ring oscillator 500 is shown implemented using series connected shift register bits 504-508, whereby each shift register bit is implemented using PMV blocks 300 as discussed above in relation to FIGS. 3 and 4. As illustrated, any number of shift register bits may be cascaded depending upon the nominal frequency that is required from ring oscillator 500.

Coupling the output of the last shift register bit 508 to the input of the first shift register bit 504 in a feedback fashion, a ring oscillator may be formed. By coupling a logic element, such as NAND gate 502, in series within the feedback path as shown, ring oscillator 500 may be enabled to oscillate in response to signal ENABLE. If the logic value of signal ENABLE is a logic high value, for example, then NAND gate 502 operates as an inverter, which provides the odd number of inverter stages that are required within ring oscillator 500 for oscillation to occur. If, on the other hand, the logic value of signal ENABLE is at a logic low value, then ring oscillator 500 is disabled and no oscillation occurs.

In one embodiment, 128 shift register bits may be cascaded in series to generate a 128-bit shift register. The drive level that is selected for each shift register bit via control signals CTRL3-CTRL0 then determines the oscillation frequency of ring oscillator 500. For example, if control signal CTRL0 is asserted and control signals CTRL3-CTRL1 are deasserted, then the "fast" process corner may be simulated, which provides a maximum oscillation frequency of ring oscillator 500. Conversely, if control signal CTRL3 is asserted and control signals CTRL2-CTRL0 are deasserted, then the "weak" process corner may be simulated, which provides a minimum oscillation frequency (if any) of ring oscillator 500.

Independent assertion of control signals CTRL2 and CTRL1 and the subsequent oscillation frequencies measured in response thereto completes the characterization of ring oscillator 500 over 4 distinct process corner simulations. It is understood that any number of drive levels may be simulated in a similar manner to characterize the performance of memory cell implemented ring oscillator 500 over a plurality of process corners.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. In an integrated circuit device, a process monitor vehicle, comprising:
    a plurality of shift register bits coupled in series;
    a logic gate coupled to receive an enable signal and an output signal from a last shift register bit of the plurality of shift register bits and coupled to provide an input signal to a first shift register bit of the plurality of shift register bits, wherein each shift register bit includes,
    a memory cell block adapted to latch the input signal;
    a first inverter coupled to receive the latched input signal from the memory cell block and adapted to provide the latched input signal as an output signal in response to a programmable drive current; and
    a write driver coupled to a power supply reference of the first inverter, wherein the write driver is adapted to conduct a programmable magnitude of current from the power supply reference of the first inverter to set the programmable drive current, wherein the memory cell block comprises:
        a second inverter having an input coupled to a first node and an output coupled to a second node; and
        a third inverter having an input coupled to the second node and an output coupled to the first node;
        a first pass gate having a first conductor coupled to the first node; and
        a second pass gate having a first conductor coupled to the second node; and
        a fourth inverter having an input coupled to the second node.

2. The process monitor vehicle of claim 1, wherein the logic gate comprises a NAND gate.

3. The process monitor vehicle of claim 1, wherein the memory cell block further comprises a programming circuit, the programming circuit including,
    a third pass gate having a first conductor coupled to receive the input signal and a second conductor adapted to provide the input signal to the second node.

4. The process monitor vehicle of claim 3, wherein the programming circuit further comprises:
    a fourth pass gate having a first conductor coupled to receive a reference potential; and
    a fifth pass gate having a first conductor coupled to a second conductor of the fourth pass gate and a second conductor coupled to the first node.

5. The process monitor vehicle of claim 1, wherein the write driver comprises a plurality of transistor stacks, each transistor stack including at least one transistor having a first conductor coupled to the power supply reference of the first inverter and a control terminal coupled to receive a control signal.

6. The process monitor vehicle of claim 5, wherein the at least one transistor of each transistor stack is geometrically dimensioned to conduct the programmable magnitude of current in response to the control signal.

7. A process monitor vehicle block, comprising:
    a memory cell block adapted to latch an input signal;
    a first inverter coupled to receive the latched input signal from the memory cell block and adapted to provide the latched input signal as an output signal in response to a programmable drive current; and
    a write driver coupled to a power supply reference of the first inverter, wherein the write driver is adapted to conduct a programmable magnitude of current from the power supply reference of the first inverter to set the programmable drive current, wherein the memory cell block comprises:
        a second inverter having an input coupled to a first node and an output coupled to a second node; and
        a third inverter having an input coupled to the second node and an output coupled to the first node;
        a first pass gate having a first conductor coupled to the first node; and
        a second pass gate having a first conductor coupled to the second node; and
        a fourth inverter having an input coupled to the second node.

8. The process monitor vehicle block of claim 7, wherein the memory cell block further comprises a programming circuit, the programming circuit including,
    a third pass gate having a first conductor coupled to receive the input signal and a second conductor adapted to provide the input signal to the second node.

9. The process monitor vehicle block of claim 8, wherein the programming circuit further comprises:
    a fourth pass gate having a first conductor coupled to receive a reference potential; and
    a fifth pass gate having a first conductor coupled to a second conductor of the fourth pass gate and a second conductor coupled to the first node.

10. The process monitor vehicle block of claim 7, wherein the write driver comprises a plurality of transistor stacks, each transistor stack including at least one transistor having a first conductor coupled to the power supply reference of the first inverter and a control terminal coupled to receive a control signal.

11. The process monitor vehicle block of claim 10, wherein the at least one transistor of each transistor stack is geometrically dimensioned to conduct the programmable magnitude of current in response to the control signal.

12. An integrated circuit device, comprising:
a plurality of programmable logic blocks coupled to receive configuration data into a plurality of memory cells, the plurality of programmable logic blocks including programmable logic devices and programmable interconnections that are configured to perform a logic function in response to the configuration data; and
a plurality of process monitor vehicle blocks disposed within the plurality of programmable logic blocks, each process monitor vehicle block including,
a memory cell adapted to latch an input signal;
an inverter coupled to receive the latched input signal from the memory cell and adapted to provide the latched input signal as an output signal in response to a programmable drive current; and
a write driver coupled to a power supply reference of the inverter, wherein the write driver is adapted to conduct a programmable magnitude of current from the power supply reference of the inverter to set the programmable drive current, wherein the memory cell comprises:
a second inverter having an input coupled to a first node and an output coupled to a second node; and
a third inverter having an input coupled to the second node and an output coupled to the first node;
a first pass gate having a first conductor coupled to the first node; and
a second pass gate having a first conductor coupled to the second node; and
a fourth inverter having an input coupled to the second node.

13. The integrated circuit device of claim 12, wherein the plurality of process monitor vehicle blocks are coupled in series to form a shift register.

14. The integrated circuit device of claim 13, wherein an output of the shift register is coupled to an input of the shift register via a logic gate to form a ring oscillator, the ring oscillator adapted to oscillate at a frequency that is dependent upon the programmable magnitude of current conducted by each write driver of each PMV block.

* * * * *